(12) United States Patent
Park

(10) Patent No.: US 11,232,744 B2
(45) Date of Patent: *Jan. 25, 2022

(54) ORGANIC LIGHT EMITTING DIODE DISPLAY DEVICE

(71) Applicant: SAMSUNG DISPLAY CO., LTD., Yongin-si (KR)

(72) Inventor: Kyong-Tae Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/024,568

(22) Filed: Sep. 17, 2020

(65) Prior Publication Data
US 2021/0005133 A1 Jan. 7, 2021

Related U.S. Application Data

(63) Continuation of application No. 15/495,573, filed on Apr. 24, 2017, now Pat. No. 10,789,881.

(30) Foreign Application Priority Data

Apr. 28, 2016 (KR) .................. 10-2016-0052153

(51) Int. Cl.
G09G 3/3208 (2016.01)
H01L 27/32 (2006.01)

(52) U.S. Cl.
CPC ... *G09G 3/3208* (2013.01); *G09G 2300/0819* (2013.01); *G09G 2300/0842* (2013.01);
(Continued)

(58) Field of Classification Search
CPC ........ G09G 3/3233; G09G 2300/0413; G09G 2300/0426; G09G 2300/0876; G09G 2300/0809; G09G 2300/0819; G09G 2300/0861; G09G 2310/0251; G09G 2310/0245; G09G 2310/063;
(Continued)

(56) References Cited

U.S. PATENT DOCUMENTS

2010/0182352 A1* 7/2010 Nakamura ........... G09G 3/3225
345/691
2012/0274622 A1* 11/2012 Huang ..................... G09G 5/10
345/212
(Continued)

FOREIGN PATENT DOCUMENTS

KR  2001-0081707    8/2001
KR  10-0666639      1/2007
(Continued)

*Primary Examiner* — Nitin Patel
*Assistant Examiner* — Amen W Bogale
(74) *Attorney, Agent, or Firm* — Lewis Roca Rothgerber Christie LLP

(57) ABSTRACT

An organic light emitting diode (OLED) display device includes a display panel having a display region and a peripheral region, an OLED at the display region and including an end connected to a first voltage, a pixel circuit at the display region, a repair pixel circuit at the peripheral region, a repair line for connecting the repair pixel circuit to the OLED, and a switching circuit configured to apply a second voltage to the repair line during a power-up of the OLED display device.

24 Claims, 12 Drawing Sheets

(52) U.S. Cl.
CPC . *G09G 2320/0233* (2013.01); *G09G 2330/08* (2013.01); *H01L 27/3276* (2013.01); *H01L 2251/568* (2013.01)

(58) Field of Classification Search
CPC ....... G09G 2310/061; G09G 2310/062; G09G 2320/0233; G09G 2320/045; G09G 2330/02; G09G 2330/08; G09G 2330/10; G02F 1/136259; H01L 2251/568
See application file for complete search history.

(56) References Cited

U.S. PATENT DOCUMENTS

| | | | | | |
|---|---|---|---|---|---|
| 2014/0292827 | A1* | 10/2014 | Kang | ................... | G09G 3/3233 345/690 |
| 2014/0313106 | A1* | 10/2014 | In | ........................ | G09G 3/3233 345/76 |
| 2014/0346475 | A1* | 11/2014 | Cho | ..................... | H01L 27/326 257/40 |
| 2014/0347401 | A1* | 11/2014 | Hwang | ................ | G09G 3/3233 345/690 |
| 2015/0108437 | A1* | 4/2015 | Cho | ..................... | H01L 27/3248 257/40 |
| 2015/0248861 | A1* | 9/2015 | Kong | ................... | G09G 3/3233 345/212 |
| 2015/0294618 | A1* | 10/2015 | Park | ..................... | G09G 3/3291 345/214 |
| 2015/0348466 | A1* | 12/2015 | Park | ..................... | G09G 3/3233 345/205 |
| 2016/0104421 | A1* | 4/2016 | Park | ..................... | G09G 3/3233 345/212 |
| 2016/0217735 | A1* | 7/2016 | Park | ..................... | G09G 3/3233 |
| 2016/0365032 | A1* | 12/2016 | Wu | ....................... | G09G 3/3233 |
| 2019/0080650 | A1* | 3/2019 | Fu | ........................ | G09G 3/3266 |

FOREIGN PATENT DOCUMENTS

| | | |
|---|---|---|
| KR | 10-2015-0069921 | 6/2015 |
| KR | 10-2016-0092593 | 8/2016 |

* cited by examiner

ORGANIC LIGHT EMITTING DIODE DISPLAY DEVICE

CROSS-REFERENCE TO RELATED APPLICATIONS

This application is a continuation of U.S. patent application Ser. No. 15/495,573, filed Apr. 24, 2017, which claims priority to and the benefit of Korean Patent Application No. 10-2016-0052153, filed Apr. 28, 2016, the entire content of both of which is incorporated herein by reference.

BACKGROUND

1. Technical Field

Example embodiments relate to a display device and to an organic light emitting diode (OLED) display device including a repair pixel circuit.

2. Description of the Related Art

While an organic light emitting diode (OLED) display device is manufactured, a defect, such as a short circuit defect, a crack, etc., may occur in some pixel circuits, and the pixel circuit having the crack may not operate normally. For example, a pixel including the defective pixel circuit may be perceived by a viewer as a bright spot that always emits light regardless of a scan signal and a data signal applied to the defective pixel circuit, or as a dark spot that never emits light regardless of the applied scan and data signals.

Recently, to repair the defective pixel circuit, an OLED display device including a repair pixel circuit has been developed. In this OLED display device, the defective pixel circuit in the pixel may be disconnected from an OLED in the pixel by laser cutting or the like, the OLED may then be connected to a repair line by laser irradiation or the like, and thus the OLED may be connected through the repair line to the repair pixel circuit instead of the defective pixel circuit. Accordingly, because the repair pixel circuit operating normally (instead of the defective pixel circuit that does not operate normally) provides a driving current to the OLED, the pixel including the OLED may emit light normally. However, due to the repair line of this OLED display device, there may exist a problem wherein the OLED connected to the repair line may undesirably emit light during a power-up of the OLED display device.

SUMMARY

Some example embodiments provide an organic light emitting diode (OLED) display device capable of preventing an undesired light-emission of an OLED connected to a repair line during a power-up of the OLED display device.

According to example embodiments, there is provided an OLED display device including a display panel having a display region and a peripheral region, an OLED at the display region and including an end connected to a first voltage, a pixel circuit at the display region, a repair pixel circuit at the peripheral region, a repair line for connecting the repair pixel circuit to the OLED, and a switching circuit configured to apply a second voltage to the repair line during a power-up of the OLED display device.

The second voltage may be activated before the first voltage is activated.

The first voltage may be a low power supply voltage, and the second voltage may be a gate low voltage.

The first voltage may be a low power supply voltage, and the second voltage may be an initialization voltage.

The second voltage may be activated when the first voltage is activated.

The first voltage and the second voltage may be a same low power supply voltage.

The switching circuit may be configured to initialize the repair line such that a voltage between an anode electrode of the OLED and a cathode electrode of the OLED is lower than a threshold voltage of the OLED.

The cathode electrode of the OLED may be connected to the first voltage, wherein the anode electrode of the OLED is connected to the repair pixel circuit instead of to the pixel circuit when the pixel circuit is defective, and wherein the second voltage is lower than a sum of the first voltage and the threshold voltage of the OLED.

The anode electrode of the OLED may be connected to the first voltage, wherein the cathode electrode of the OLED is connected to the repair pixel circuit instead of the pixel circuit when the pixel circuit is defective, and wherein the second voltage is higher than the first voltage less the threshold voltage of the OLED.

The switching circuit may include a repair line initialization transistor that is configured to connect the second voltage to the repair line.

The repair line initialization transistor may be configured to receive a repair line initialization signal from a timing controller included in the OLED display device, and may be configured to connect the second voltage to the repair line in response to the repair line initialization signal.

The repair line initialization transistor may include a source connected to the repair line, a drain connected to the second voltage, and a gate, and the switching circuit may further include a capacitor connected between the gate of the repair line initialization transistor and the drain of the repair line initialization transistor, and a resistor connected between a third voltage and the gate of the repair line initialization transistor.

The third voltage may be configured to be activated during or after activation of the second voltage.

The repair line initialization transistor may be configured to be turned on in response to the activated second voltage to connect the second voltage to the repair line, and the repair line initialization transistor may be configured to be turned off in response to the activated third voltage to disconnect the second voltage from the repair line.

The third voltage may be a high power supply voltage.

The third voltage may be a gate high voltage.

The OLED display device may further include another switching circuit configured to apply the second voltage to another repair line during the power-up of the OLED display device, wherein the resistor connected to the third voltage is shared by the switching circuit and the another switching circuit.

The repair line initialization transistor may include a source connected to the repair line, a drain connected to the second voltage, and a gate, and the switching circuit may further include a capacitor connected between the gate of the repair line initialization transistor and a fourth voltage, and a resistor connected between a third voltage and the gate of the repair line initialization transistor.

The first voltage may be a low power supply voltage, the second voltage may be an initialization voltage, and the fourth voltage may be a gate low voltage.

According to example embodiments, there is provided an OLED display device including a display panel having a display region and a peripheral region, an OLED at the display region, and including an end connected to a first voltage, a pixel circuit at the display region, a repair pixel circuit at the peripheral region, a repair line for connecting the repair pixel circuit to the OLED, and a repair line initialization transistor including a source connected to the repair line, and a drain connected to a second voltage.

The second voltage may be configured to be activated before or during activation of the first voltage.

The first voltage may be a low power supply voltage, and the second voltage may be a gate low voltage, an initialization voltage, or the low power supply voltage.

The OLED display device may further include a capacitor connected between a gate of the repair line initialization transistor and the drain of the repair line initialization transistor, and a resistor connected between a third voltage and the gate of the repair line initialization transistor.

The third voltage may be a high power supply voltage or a gate high voltage.

As described above, during the power-up of the OLED display device, the OLED display device according to example embodiments may provide the repair line with the second voltage that is activated before, or at substantially the same time as, the activation of the first voltage connected to the OLED, thereby preventing undesired light-emission of the OLED connected to the repair line during the power-up of the OLED display device.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
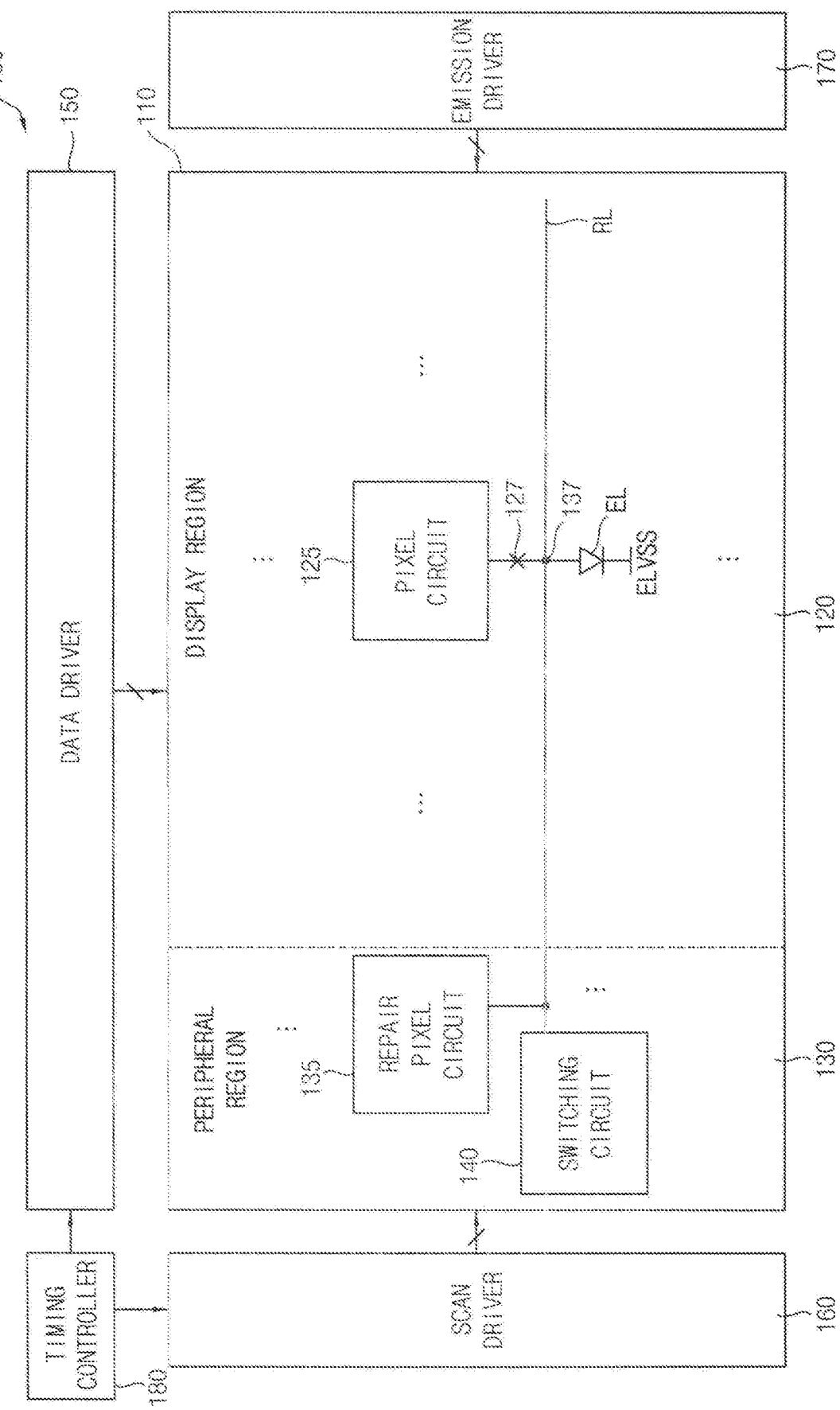
FIG. 1 is a diagram illustrating an organic light emitting diode (OLED) display device according to example embodiments.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
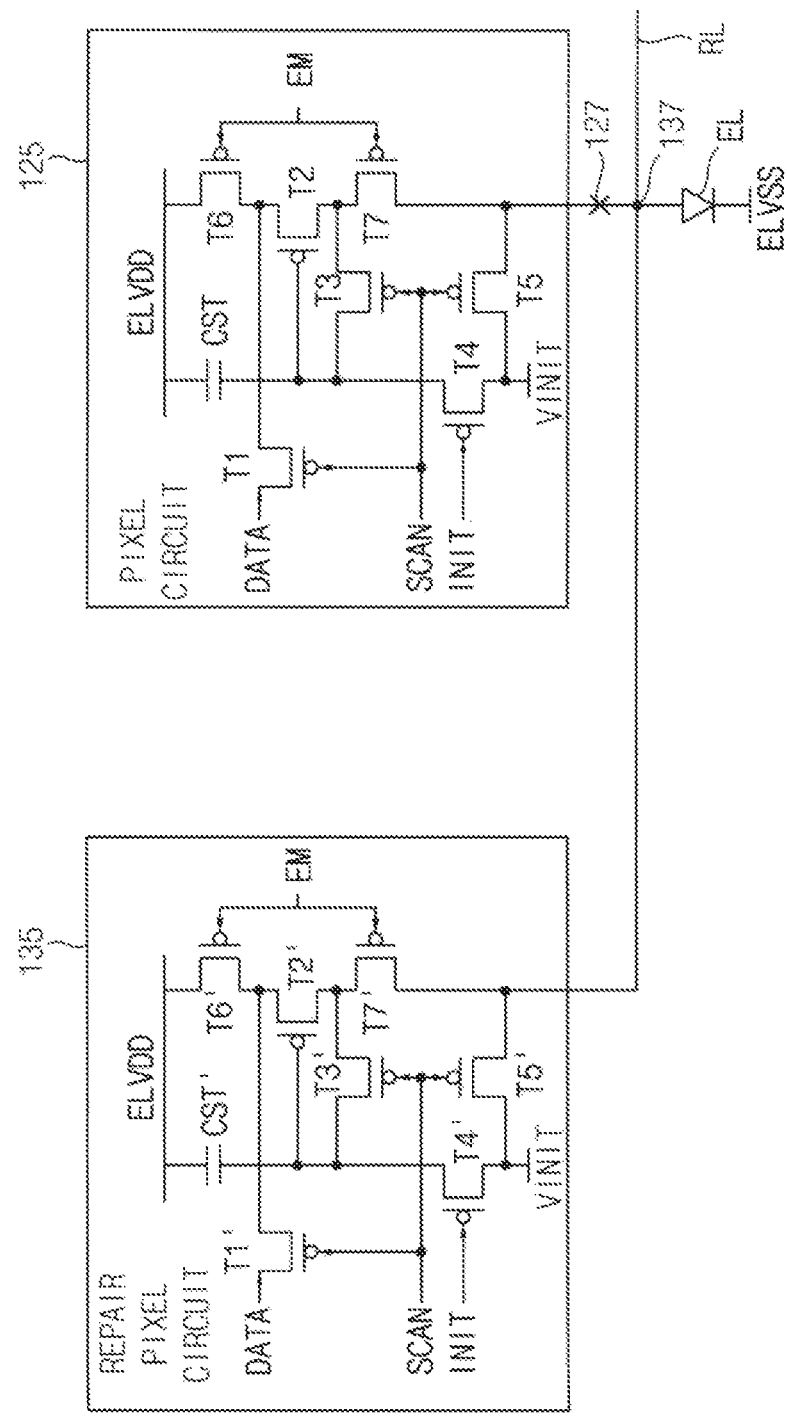
FIG. 2 is a circuit diagram illustrating an example of a pixel circuit and a repair pixel circuit included in an OLED display device of FIG. 1.
Figure 3A:
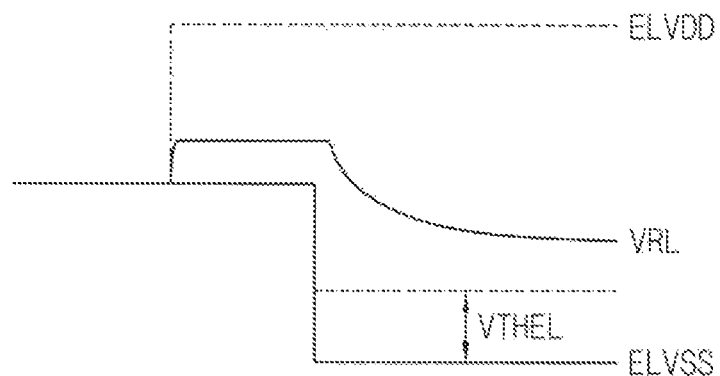
FIG. 3A is a diagram for describing a power-up sequence and a voltage of a repair line in a case where a repair line initialization operation is not performed.
Figure 3B:
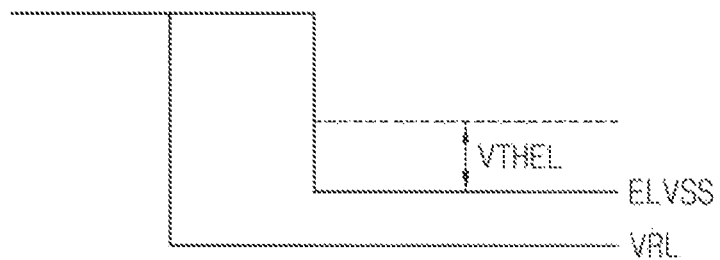
FIG. 3B is a diagram for describing a power-up sequence and a voltage of a repair line in a case where a repair line initialization operation is performed.

FIG. 1 is a diagram illustrating an organic light emitting diode (OLED) display device according to example embodiments, FIG. 2 is a circuit diagram illustrating an example of a pixel circuit and a repair pixel circuit included in an OLED display device of FIG. 1, FIG. 3A is a diagram for describing a power-up sequence and a voltage of a repair line in a case where a repair line initialization operation is not performed, and FIG. 3B is a diagram for describing a power-up sequence and a voltage of a repair line in a case where a repair line initialization operation is performed.

Referring to FIG. 1, an OLED display device 100 may include a display panel 110 including a plurality of pixels, a data driver 150 for providing data signals to the pixels, a scan driver 160 for providing scan signals and initialization signals to the pixels, an emission driver 170 for providing emission control signals to the pixels, and a timing controller 180 for controlling the data driver 150, the scan driver 160, and the emission driver 170.

The display panel 110 may have a display region 120 where OLEDs EL are formed, and may also have a peripheral region 130 around the display region 120. At the display region 120 of the display panel 110, the pixels are formed in a matrix form having a plurality of rows and a plurality of columns. Each pixel may include the OLED EL and a pixel circuit 125. One end (e.g., an anode electrode) of the OLED EL may be connected to the pixel circuit 125, and the other end (e.g., a cathode electrode) of the OLED EL may be connected to a first voltage, for example a low power supply voltage ELVSS. The pixel circuit 125 may provide a driving current to the OLED EL, and the OLED EL may emit light in response to the driving current provided from the pixel circuit 125.

In some example embodiments, as illustrated in FIG. 2, the pixel circuit 125 may include seven transistors T1, T2, T3, T4, T5, T6, and T7 and one capacitor CST. For example, the pixel circuit 125 may include a first transistor T1 configured to transfer the data signal DATA to one end of a second transistor T2 in response to the scan signal SCAN, a storage capacitor CST configured to store the data signal DATA transferred through the diode-connected second transistor T2, the second transistor T2 configured to generate the driving current based on a voltage of the storage capacitor CST, a third transistor T3 configured to diode-connect the second transistor T2 in response to the scan signal SCAN, a fourth transistor T4 configured to provide an initialization voltage VINIT to the storage capacitor CST and to a gate of the second transistor T2 in response to the initialization signal INIT, a fifth transistor T5 configured to provide the initialization voltage VINIT to the OLED EL in response to the scan signal SCAN, a sixth transistor T6 configured to connect a high power supply voltage ELVDD and the second transistor T2 in response to an emission control signal EM, and a seventh transistor T7 configured to connect the second transistor T2 and the OLED EL in response to the emission control signal EM. However, a configuration of the pixel circuit 125 of the OLED display device 100 according to example embodiments is not limited to the example illustrated in FIG. 2.

At the peripheral region 130 of the display panel 110, at least one repair pixel circuit 135 and at least one switching circuit 140 may be formed. In some example embodiments, a plurality of repair pixel circuits 135 may be arranged in one or more columns parallel to data lines. In other example embodiments, a plurality of repair pixel circuits 135 may be arranged in one or more rows parallel to scan lines. In still other example embodiments, one or more columns of the repair pixel circuits 135 and one or more rows of the repair pixel circuits 135 may be arranged.

The repair pixel circuit 135 may have a configuration that is the same as, or that is similar to, that of the pixel circuit 125 at the display region 120. For example, as illustrated in FIG. 2, in a case where the pixel circuit includes the seven transistors T1, T2, T3, T4, T5, T6, and T7 and the one capacitor CST, the repair pixel circuit 135 also may include seven transistors T1', T2', T3', T4', T5', T6', and T7' and one capacitor CST'. Thus, the repair pixel circuit 135 may perform an operation that is the same as, or that is similar to, that of the pixel circuit 125. However, a configuration of the repair pixel circuit 135 of the OLED display device 100 according to example embodiments is not limited to the example illustrated in FIG. 2.

While the OLED display device 100 is manufactured, a defect, such as a short circuit defect, a crack, etc., may occur in some pixel circuits 125. A pixel circuit 125 having a crack may not operate normally, and the OLED EL connected to the defective pixel circuit 125 might not emit light with desired luminance. In the OLED display device 100 according to example embodiments, in a case where the pixel circuit 125 is defective, the repair pixel circuit 135 operating normally (instead of the defective pixel circuit 125) may provide the driving current to the OLED EL. For example, connection 127 between the defective pixel circuit 125 and the OLED EL may be cut by laser cutting or the like. Further, the OLED EL and a repair line RL may be connected at a connection point 137 by laser irradiation or the like, and thus the OLED EL may be connected through the repair line RL to the repair pixel circuit 135 instead of being connected to the defective pixel circuit 125. Accordingly, because the repair pixel circuit 135 operating normally provides the driving current (instead of the defective pixel circuit 125) to the OLED EL, the OLED EL may emit light with desired luminance.

As described above, even if the OLED display device 100 according to example embodiments has a defective pixel circuit 125, the OLED EL may be driven by the repair pixel circuit 135 instead of the defective pixel circuit 125, and thus the OLED EL may emit light with desired luminance, thereby improving image quality of the OLED display device 100. However, in the OLED display device 100 including the repair pixel circuit 135 and the repair line RL, the OLED EL connected to the repair line RL may undesirably emit light during a power-up of the OLED display device 100. For example, during the power-up of the OLED display device 100, as illustrated in FIG. 3A, the repair line RL may have a voltage close to a ground voltage (e.g., about 0V), and voltages ELVDD and ELVSS of the OLED display device 100 may be activated according to a power-up sequence (e.g., a predetermined, or preprogrammed, power-up sequence).

When the lower power supply voltage ELVSS connected to the cathode electrode of the OLED EL is activated, for example, to about −4V through about −4.5V, a voltage difference between a voltage VRL of the repair line RL, which is connected to the anode electrode of the OLED EL, and the lower power supply voltage ELVSS, which is connected to the cathode electrode of the OLED EL, may be higher than a threshold voltage VTHEL of the OLED EL, and thus, the OLED EL may undesirably emit light until the voltage VRL of the repair line RL becomes lower than a sum of the lower power supply voltage ELVSS and the threshold voltage VTHEL of the OLED EL. In addition, before the lower power supply voltage ELVSS is activated, the high power supply voltage ELVDD is activated according to the power-up sequence, and thus the voltage VRL of the repair line RL may be increased from the voltage that is close to the ground voltage because of coupling with a power supply voltage line of the high power supply voltage ELVDD, thereby increasing the voltage difference between the voltage VRL of the repair line RL and the lower power supply voltage ELVSS. Accordingly, intensity and time of the undesired light-emission of the OLED EL during the power-up may be further increased.

However, in the OLED display device 100 according to example embodiments, the switching circuit 140 may apply a second voltage to the repair line RL during the power-up of the OLED display device 100. In some example embodiments, during the power-up of the OLED display device 100, the switching circuit 140 may provide the repair line RL with the second voltage that is activated at a time that is before, or that is at substantially the same time as, a time the first voltage is activated. For example, the first voltage may be the low power supply voltage ELVSS, and the second voltage may be a gate low voltage VGL, the initialization voltage VINIT, or the low power supply voltage ELVSS.

The switching circuit 140 may initialize the repair line RL by applying the second voltage to the repair line RL such that a voltage between the anode electrode and the cathode electrode of the OLED EL is lower than the threshold voltage VTHEL of the OLED EL. For example, as illustrated in FIG. 3B, before (or substantially the same time when) the low power supply voltage ELVSS is activated, the switching circuit 140 may provide the repair line RL with the second voltage lower than the activated low power supply voltage ELVSS plus the threshold voltage VTHEL or than the activated low power supply voltage ELVSS, and thus may initialize the repair line RL such that the voltage VRL of the repair line RL may be lower than the sum of the activated low power supply voltage ELVSS plus the threshold voltage VTHEL, or may be lower than the activated low power supply voltage ELVSS. Accordingly, the OLED display device 100 may prevent the OLED EL that is connected to the repair line RL from undesirably emitting light due to the voltage difference between the voltage VRL of the repair line RL and the lower power supply voltage ELVSS during the power-up of the OLED display device 100.

As described above, the OLED display device 100 according to example embodiments may provide the repair line RL with the second voltage (e.g., the gate low voltage VGL, the initialization voltage VINIT, or the low power supply voltage ELVSS) that is activated either when, or before, the first voltage (e.g., the low power supply voltage ELVSS) is activated, thereby preventing the undesired light-emission of the OLED EL connected to the repair line RL during the power-up of the OLED display device 100.

FIG. 1 illustrates an example where the cathode electrode of the OLED EL is connected either to the first voltage or to the low power supply voltage ELVSS, where the anode electrode of the OLED EL is connected through the repair line RL to the repair pixel circuit 135 instead of the pixel circuit 125 when the pixel circuit 125 is defective, and where the second voltage (e.g., the gate low voltage VGL, the initialization voltage VINIT, or the low power supply voltage ELVSS) is lower than the sum of the first voltage and the threshold voltage VTHEL of the OLED EL. However, in other example embodiments, the anode electrode of the OLED EL may be connected to the first voltage (e.g., the high power supply voltage ELVDD), the cathode electrode of the OLED EL may be connected through the repair line RL to the repair pixel circuit 135 instead of the pixel circuit 125 when the pixel circuit 125 is defective, and the second voltage may be higher than a voltage equal to the first voltage less the threshold voltage VTHEL of the OLED EL.

Figure 4:
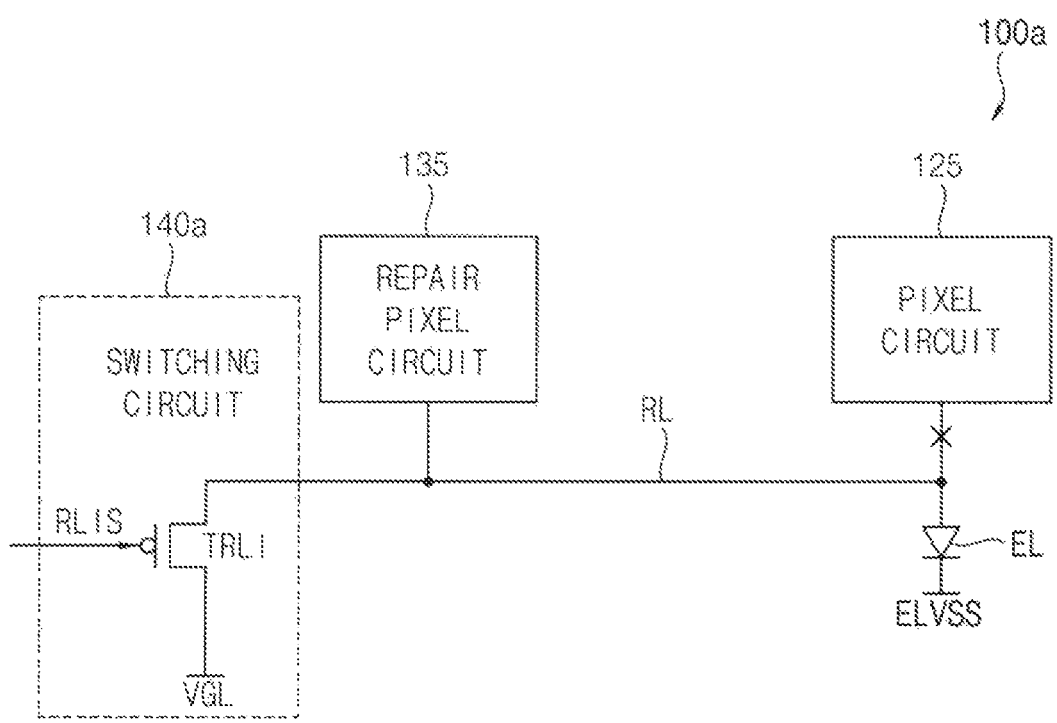
FIG. 4 is a diagram illustrating a portion of an OLED display device according to example embodiments.
Figure 5:
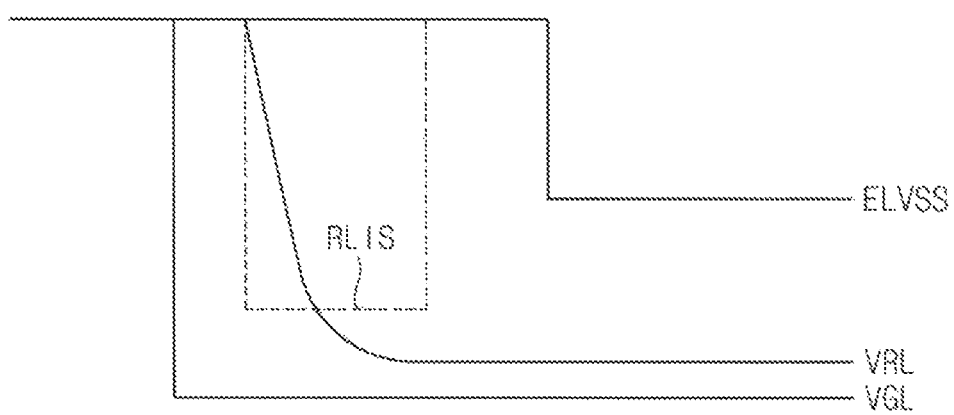
FIG. 5 is a timing diagram illustrating an example of a power-up sequence and a voltage of a repair line of an OLED display device of FIG. 4.

FIG. 4 is a diagram illustrating a portion of an OLED display device according to example embodiments, and FIG. 5 is a timing diagram illustrating an example of a power-up sequence and a voltage of a repair line of an OLED display device of FIG. 4.

Referring to FIG. 4, an OLED display device 100a including a display panel having a display region and a peripheral region may include an OLED EL formed at the display region and having one end connected to a first voltage (e.g., a low power supply voltage ELVSS), a pixel circuit 125 formed at the display region, a repair pixel circuit 135 formed at the peripheral region, a repair line RL for connecting the OLED EL to the repair pixel circuit 135 instead of the pixel circuit 125 when the pixel circuit 125 is defective, and a switching circuit 140a for applying a second voltage (e.g., a gate low voltage VGL) to the repair line RL during a power-up of the OLED display device 100a.

The switching circuit 140a may include a repair line initialization transistor TRLI configured to connect the gate low voltage VGL to the repair line RL in response to a repair line initialization signal RLIS. The repair line initialization signal RLIS may be provided from a separate circuit that is either inside or outside the display panel. In some example embodiments, the repair line initialization signal RLIS may be generated by a timing controller of the OLED display device 100a, and the repair line initialization transistor TRLI may receive the repair line initialization signal RLIS from the timing controller. Although FIG. 4 illustrates an example where the repair line initialization transistor TRLI is implemented with a PMOS transistor, in some example embodiments, the repair line initialization transistor TRLI may be implemented with an NMOS transistor.

The switching circuit 140a may apply the gate low voltage VGL to the repair line RL in response to the repair line initialization signal RLIS during the power-up of the OLED display device 100a. In some example embodiments, as illustrated in FIG. 5, according to a power-up sequence of the OLED display device 100a, the gate low voltage VGL may be activated before the low power supply voltage ELVSS connected to the OLED EL is activated. The repair line initialization transistor TRLI may be turned on in response to the repair line initialization signal RLIS during at least a time period after the activation of the gate low voltage VGL and before the activation of the low power supply voltage ELVSS. The gate low voltage VGL may be applied to the repair line RL by the turned-on repair line initialization transistor TRLI, and the repair line RL may be initialized to have a voltage VRL that is lower than the low power supply voltage ELVSS. Accordingly, undesired light-emission of the OLED EL caused by a voltage difference between the voltage VRL of the repair line RL and the lower power supply voltage ELVSS during the power-up of the OLED display device 100a may be prevented.

Figure 6:
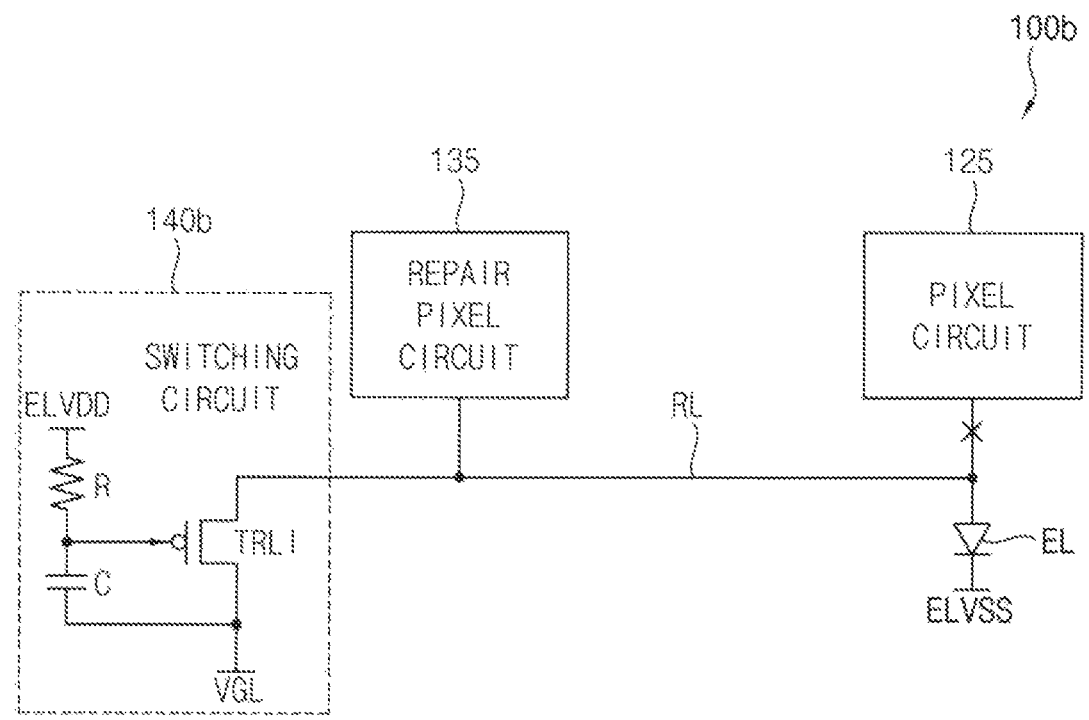
FIG. 6 is a diagram illustrating a portion of an OLED display device according to example embodiments.
Figure 7:
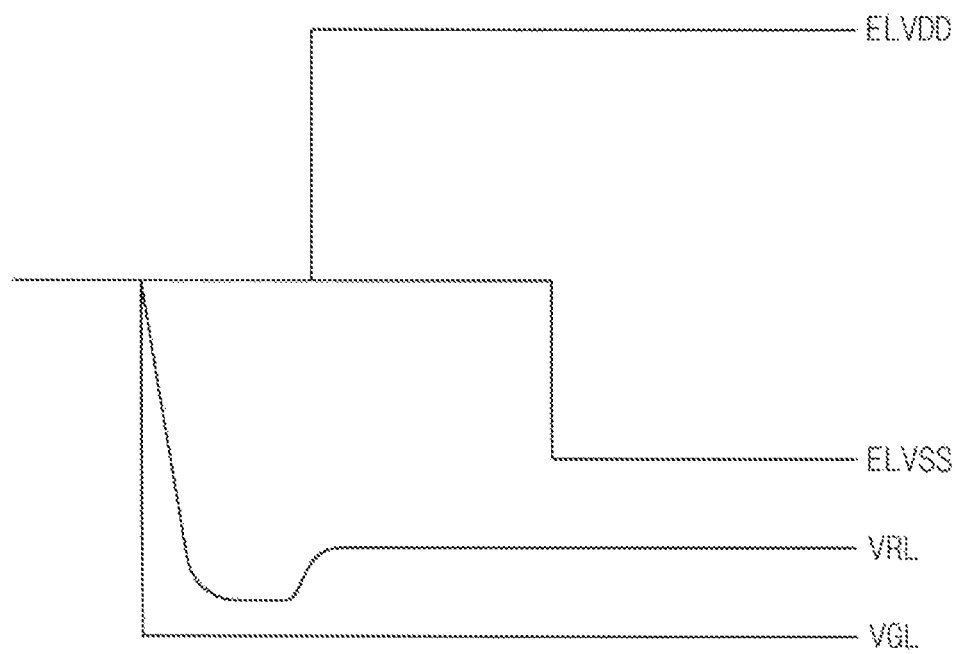
FIG. 7 is a timing diagram illustrating an example of a power-up sequence and a voltage of a repair line of an OLED display device of FIG. 6.

FIG. 6 is a diagram illustrating a portion of an OLED display device according to example embodiments, and FIG. 7 is a timing diagram illustrating an example of a power-up sequence and a voltage of a repair line of an OLED display device of FIG. 6.

Referring to FIG. 6, in an OLED display device 100b according to example embodiments, one end (e.g., a cathode electrode) of an OLED EL may be connected to a first voltage (e.g., a low power supply voltage ELVSS), and the other end (e.g., an anode electrode) of the OLED EL may be connected to a repair line RL. A switching circuit 140b included in the OLED display device 100b may provide the repair line RL with a second voltage (e.g., a gate low voltage VGL) that is activated before or during activation of the first voltage.

The switching circuit 140b of the OLED display device 100b may include a repair line initialization transistor TRLI having a source connected to the repair line RL, a drain connected to the second voltage (e.g., the gate low voltage VGL), and a gate. The OLED display device 100b may also include a capacitor C connected between the gate of the repair line initialization transistor TRLI and the drain of the repair line initialization transistor TRLI, and a resistor R connected between a third voltage (e.g., a high power supply voltage ELVDD) and the gate of the repair line initialization transistor TRLI. In some example embodiments, the third voltage may be activated after, or at substantially the same time as, activation of the second voltage. In some example embodiments, as illustrated in FIG. 6, the third voltage may be the high power supply voltage ELVDD that is activated after the gate low voltage VGL is activated.

In some example embodiments, as illustrated in FIG. 7, according to a power-up sequence of the OLED display device 100b, the gate low voltage VGL, the high power supply voltage ELVDD, and the low power supply voltage ELVSS may be sequentially activated in the order of the gate low voltage VGL, the high power supply voltage ELVDD, and the low power supply voltage ELVSS. If the gate low voltage VGL is activated, a voltage of the drain of the repair line initialization transistor TRLI may be decreased to the activated gate low voltage VGL, a voltage of the gate of the repair line initialization transistor TRLI also may be decreased because of coupling by the capacitor C.

The repair line initialization transistor TRLI may be turned on based on the decreased gate voltage, and the turned-on repair line initialization transistor TRLI may connect the gate low voltage VGL to the repair line RL. Thus, the repair line RL may be initialized to have the activated gate low voltage VGL, or may be initialized to have a voltage close to the activated gate low voltage VGL. Subsequently, if the high power supply voltage ELVDD is activated, a current may flow from the high power supply voltage ELVDD through the resistor R to the capacitor C, and the gate voltage of the repair line initialization transistor TRLI may be increased. The repair line initialization transistor TRLI may be turned off based on the increased gate voltage thereof, and the turned-off repair line initialization transistor TRLI may disconnect the gate low voltage VGL from the repair line RL. Thus, the switching circuit 140b may not affect a normal operation after the power-up of the OLED display device 100b. Subsequently, even if the low power supply voltage ELVSS is activated, the OLED EL may be prevented from undesirably emitting light because the repair line RL is previously initialized to have a voltage VRL that is lower than the low power supply voltage ELVSS. As described above, the switching circuit 140b may prevent the undesired light-emission of the OLED EL otherwise caused by a voltage difference between the voltage VRL of the repair line RL and the lower power supply voltage ELVSS during the power-up of the OLED display device 100b.

Figure 8:
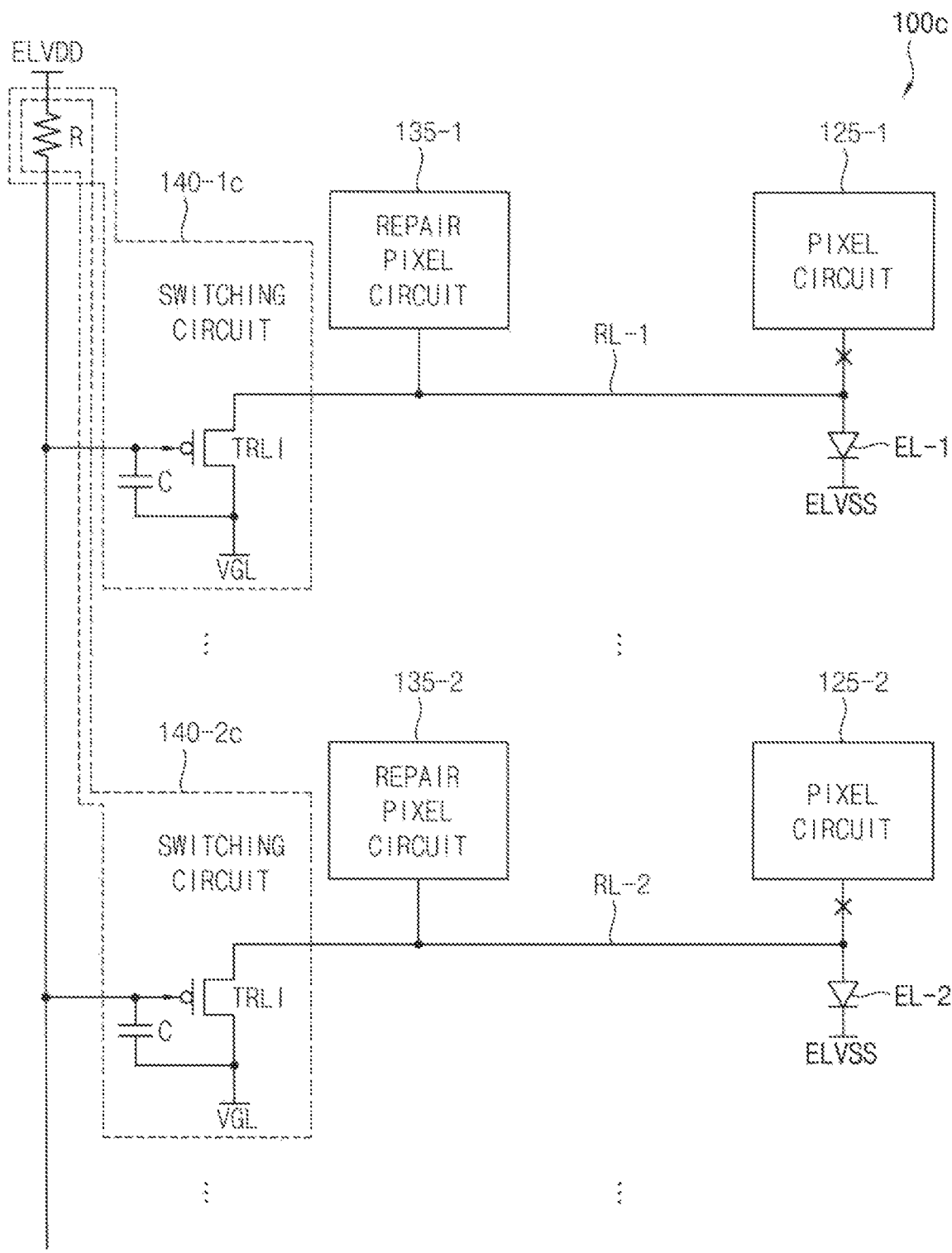
FIG. 8 is a diagram illustrating a portion of an OLED display device according to example embodiments.

FIG. 8 is a diagram illustrating a portion of an OLED display device according to example embodiments.

Referring to FIG. 8, an OLED display device 100c may include a plurality of pixel circuits 125-1 and 125-2 and a plurality of OLEDs EL-1 and EL-2 at a display region of a display panel, and may include a plurality of repair pixel circuits 135-1 and 135-2 at a peripheral region of the display panel. In a case where a first pixel circuit 125-1 is defective, a first OLED EL-1 corresponding to the first pixel circuit 125-1 may be connected through a first repair line RL-1 to a first repair pixel circuit 135-1, instead of being connected to the defective first pixel circuit 125-1. In a case where a second pixel circuit 125-2 is defective, a second OLED EL-2 corresponding to the second pixel circuit 125-2 may be connected through a second repair line RL-2 to a second repair pixel circuit 135-2, instead of being connected to the defective second pixel circuit 125-2.

The OLED display device 100c may further include a plurality of switching circuits 140-1c and 140-2c respectively connected to the repair lines RL-1 and RL-2, and each switching circuit 140-1c and 140-2c may include a repair line initialization transistor TRLI, a capacitor C, and a resistor R. In some example embodiments, as illustrated in FIG. 8, the resistor R connected to a high power supply voltage ELVDD may be shared by the plurality of switching circuits 140-1c and 140-2c. Each switching circuit 140-1c and 140-2c may have the same or similar configuration and operation to the switching circuit 140b of FIG. 6, except that the switching circuits 140-1c and 140-2c share a connection to the resistor R. As described above, in the OLED display device 100c of the present embodiment, the resistor R may be shared by the switching circuits 140-1c and 140-2c, and thus, a circuit size of the switching circuits 140-1c and 140-2c may be reduced.

Figure 9:
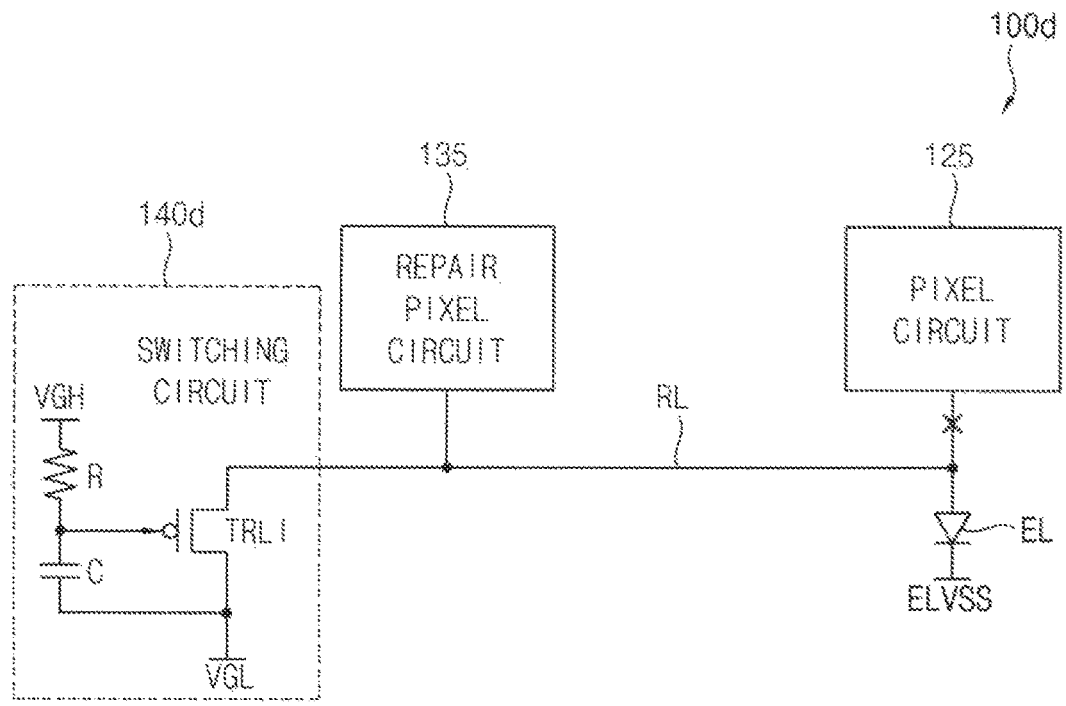
FIG. 9 is a diagram illustrating a portion of an OLED display device according to example embodiments.
Figure 10:
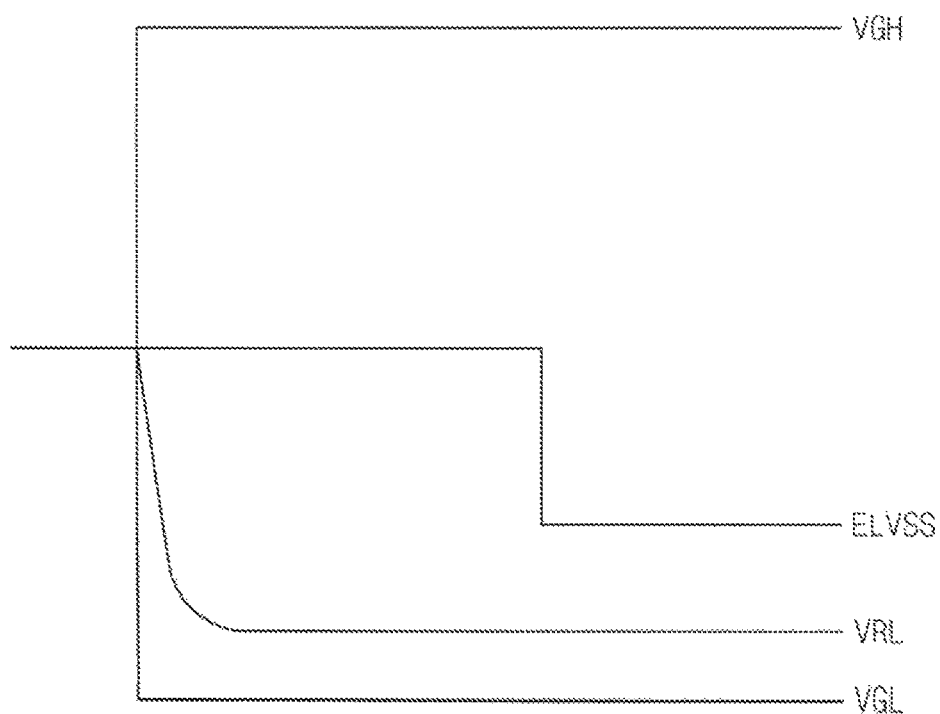
FIG. 10 is a timing diagram illustrating an example of a power-up sequence and a voltage of a repair line of an OLED display device of FIG. 9.

FIG. 9 is a diagram illustrating a portion of an OLED display device according to example embodiments, and FIG. 10 is a timing diagram illustrating an example of a power-up sequence and a voltage of a repair line of an OLED display device of FIG. 9.

Referring to FIG. 9, a switching circuit 140d of an OLED display device 100d may include a repair line initialization transistor TRLI having a source connected to a repair line RL, a drain connected to a gate low voltage VGL, and a gate. The switching circuit 140d may also include a capacitor C connected between the gate of the repair line initialization transistor TRLI and the drain of the repair line initialization transistor TRLI, and a resistor R connected between a gate high voltage VGH and the gate of the repair line initialization transistor TRLI. The switching circuit 140d of FIG. 9 may have the same or similar configuration and operation to the switching circuit 140b of the embodiment shown in FIG. 6, except that the resistor R is connected to the gate high voltage VGH instead of being connected to a high power supply voltage ELVDD.

In some example embodiments, as illustrated in FIG. 10, according to a power-up sequence of the OLED display device 100d, the gate high voltage VGH may be activated during or after activation of the gate low voltage VGL, and a low power supply voltage ELVSS may be activated after the gate low voltage VGL and the gate high voltage VGH are activated. When the gate low voltage VGL and the gate high voltage VGH are activated, a voltage of the gate of the repair line initialization transistor TRLI may be decreased because of coupling by the capacitor C, and thus, the repair line initialization transistor TRLI may be turned on based on the decreased gate voltage to initialize the repair line RL to have the activated gate low voltage VGL, or to have a voltage close to the activated gate low voltage VGL. Subsequently, the gate voltage of the repair line initialization transistor TRLI may be gradually increased based on a current flowing from the gate high voltage VGL through the resistor R to the capacitor C, and thus the repair line initialization transistor TRLI may be turned off based on the gradually increased gate voltage thereof to disconnect the gate low voltage VGL from the repair line RL. Subsequently, even if the low power supply voltage ELVSS is activated, the OLED EL may be prevented from undesirably emitting light because the repair line RL is previously initialized to have a voltage VRL that is lower than the low power supply voltage ELVSS. As described above, the switching circuit 140d may prevent the undesired light-emission of the OLED EL caused by a voltage difference between the voltage VRL of the repair line RL and the lower power supply voltage ELVSS during the power-up of the OLED display device 100d.

Figure 11:
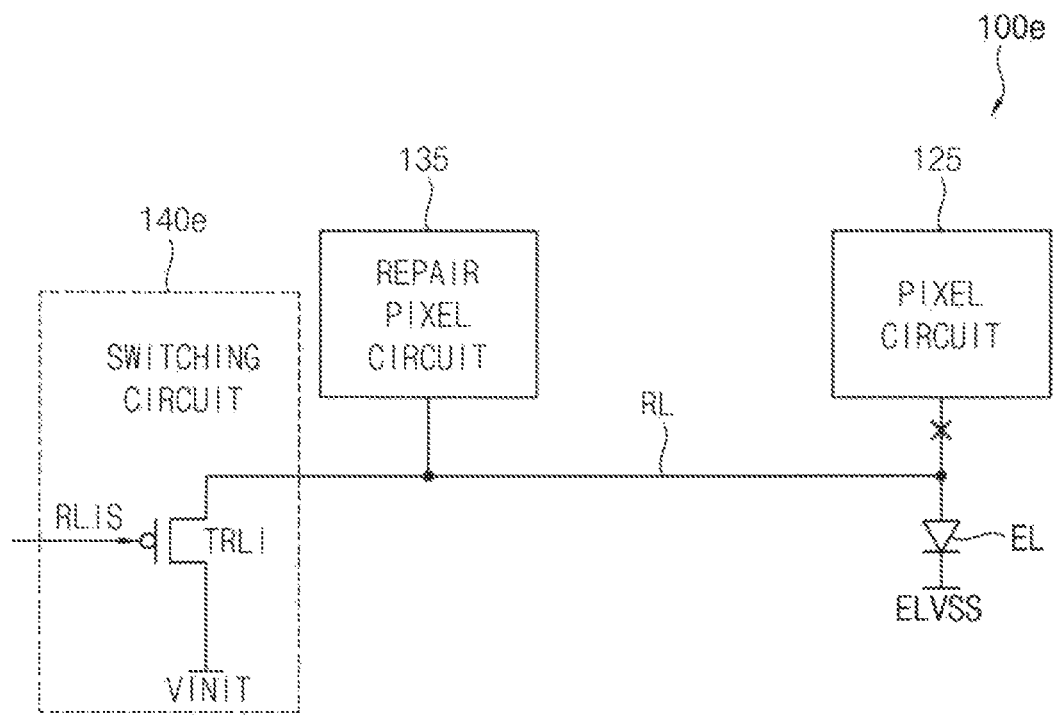
FIG. 11 is a diagram illustrating a portion of an OLED display device according to example embodiments.
Figure 12:
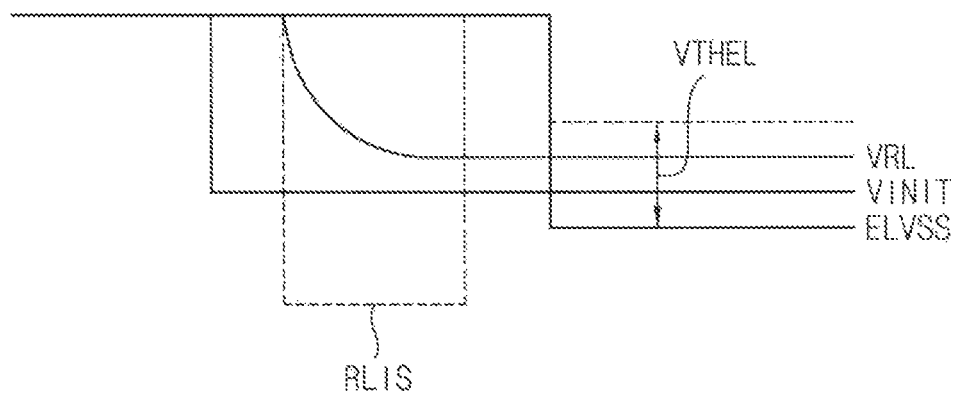
FIG. 12 is a timing diagram illustrating an example of a power-up sequence and a voltage of a repair line of an OLED display device of FIG. 11.

FIG. 11 is a diagram illustrating a portion of an OLED display device according to example embodiments, and FIG. 12 is a timing diagram illustrating an example of a power-up sequence and a voltage of a repair line of an OLED display device of FIG. 11.

Referring to FIG. 11, a switching circuit 140e of an OLED display device 100e may include a repair line initialization transistor TRLI configured to connect an initialization voltage VINT to a repair line RL in response to a repair line initialization signal RLIS. In some example embodiments, the repair line initialization signal RLIS may be generated by a timing controller of the OLED display device 100e, and the repair line initialization transistor TRLI may receive the repair line initialization signal RLIS from the timing controller. The switching circuit 140e of FIG. 11 may have the same or similar configuration and operation to the switching circuit 140a of the embodiment shown in FIG. 4, except that the initialization voltage VINT, as opposed to a gate low voltage VGL, is applied to the repair line RL. Because the repair line initialization transistor TRLI is connected to the initialization voltage VINT of which an absolute value is lower than that of the gate low voltage VGL, a leakage current through the repair line initialization transistor TRLI may be reduced.

In some example embodiments, as illustrated in FIG. 12, according to a power-up sequence of the OLED display device 100e, the initialization voltage VINT may be activated before the low power supply voltage ELVSS connected to an OLED EL is activated, and the repair line initialization transistor TRLI may be turned on in response to the repair line initialization signal RLIS during at least a time period after the activation of the initialization voltage VINT and before the activation of the low power supply voltage ELVSS. The initialization voltage VINT may be applied to the repair line RL by the turned-on repair line initialization transistor TRLI, and the repair line RL may be initialized to have a voltage VRL that is substantially the same as, or that is close to, the initialization voltage VINT. For example, the initialization voltage VINT may be a voltage of about −3.5V, which is higher than the low power supply voltage ELVSS of about −4V through about −4.5V, and thus, the repair line RL may be initialized to have the voltage VRL that is higher than the low power supply voltage ELVSS. However, the initialization voltage VINT may be lower than a sum of the low power supply voltage ELVSS and a threshold voltage VTHEL of the OLED EL, and thus, the repair line RL may be initialized to have the voltage VRL that is lower than the sum of the low power supply voltage ELVSS and the threshold voltage VTHEL of the OLED EL. Accordingly, even if the low power supply voltage ELVSS is activated, undesired light-emission of the OLED EL otherwise caused by a voltage difference between the voltage VRL of the repair line RL and the lower power supply voltage ELVSS during a power-up of the OLED display device 100e may be prevented because the repair line RL is previously initialized to have the voltage VRL that is lower than the low power supply voltage ELVSS plus the threshold voltage VTHEL of the OLED EL.

Figure 13:
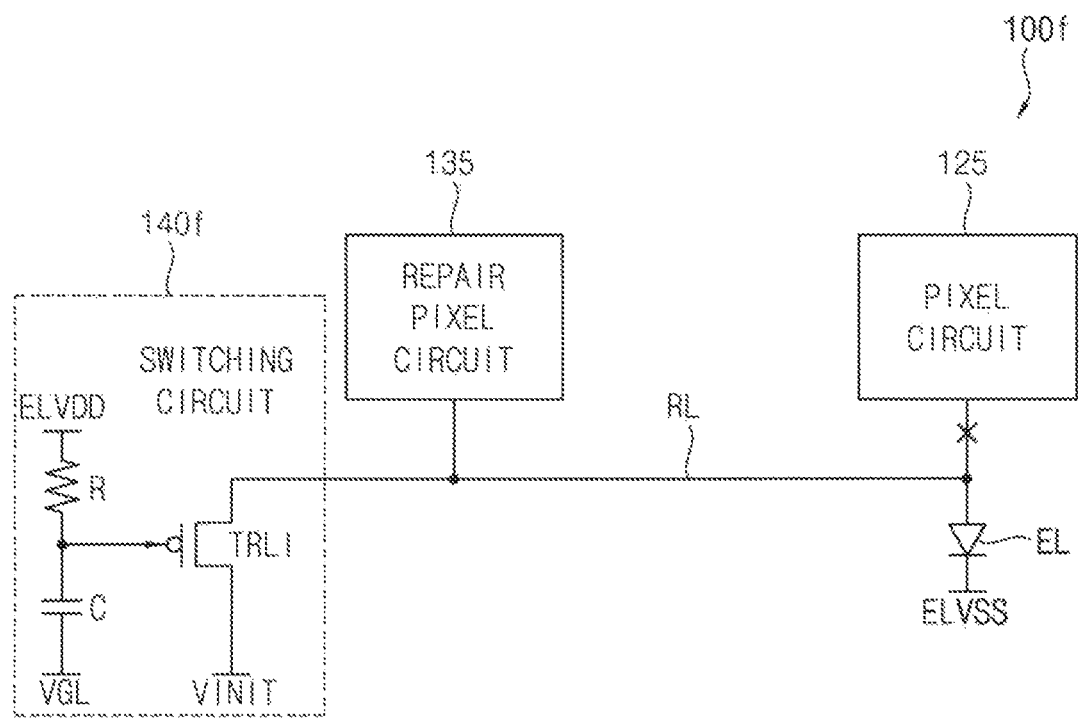
FIG. 13 is a diagram illustrating a portion of an OLED display device according to example embodiments.
Figure 14:
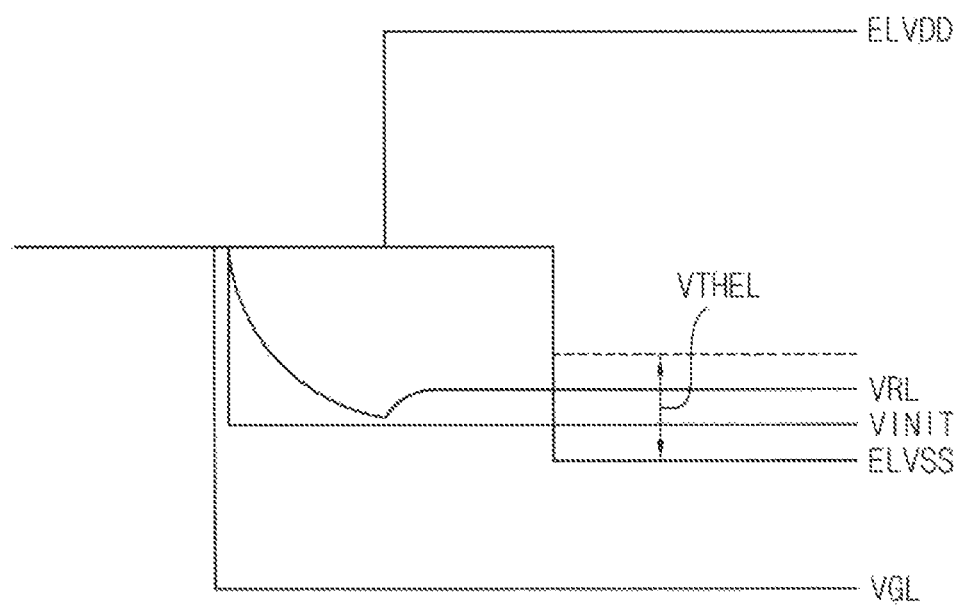
FIG. 14 is a timing diagram illustrating an example of a power-up sequence and a voltage of a repair line of an OLED display device of FIG. 13.

FIG. 13 is a diagram illustrating a portion of an OLED display device according to example embodiments, and FIG. 14 is a timing diagram illustrating an example of a power-up sequence and a voltage of a repair line of an OLED display device of FIG. 13.

Referring to FIG. 13, in an OLED display device 100f according to example embodiments, one end (e.g., a cathode electrode) of an OLED EL may be connected to a first voltage (e.g., a low power supply voltage ELVSS), and the other end (e.g., an anode electrode) of the OLED EL may be connected to a repair line RL.

A switching circuit 140f of the OLED display device 100f may include a repair line initialization transistor TRLI having a source connected to the repair line RL, a drain connected to a second voltage (e.g., an initialization voltage VINIT), and a gate. The OLED display device 100f may also include a capacitor C connected between the gate of the repair line initialization transistor TRLI and a fourth voltage (e.g., a gate low voltage VGL), and a resistor R connected between a third voltage (e.g., a high power supply voltage ELVDD) and the gate of the repair line initialization transistor TRLI. In some example embodiments, the first voltage may be the low power supply voltage ELVSS, the second voltage may be the initialization voltage VINIT, the third voltage may be the high power supply voltage ELVDD, and the fourth voltage may be the gate low voltage VGL. The switching circuit 140f of the present embodiment shown in FIG. 13 may have the same or similar configuration and operation to the switching circuit 140b of the embodiment shown in FIG. 6, except that the drain of the repair line initialization transistor TRLI is connected to the initialization voltage VINIT instead of being connected to the gate low voltage VGL.

In some example embodiments, as illustrated in FIG. 14, according to a power-up sequence of the OLED display device 100f, the gate low voltage VGL may be activated, and the initialization voltage VINIT may be activated after or during activation of the gate low voltage VGL. The high power supply voltage ELVDD may be activated after the gate low voltage VGL and the initialization voltage VINIT are activated, and the low power supply voltage ELVSS may be activated after the high power supply voltage ELVDD is activated. If the gate low voltage VGL and the initialization voltage VINIT are activated, a voltage of the gate of the repair line initialization transistor TRLI may be decreased, and thus, the repair line initialization transistor TRLI may be turned on to initialize the repair line RL to have the activated initialization voltage VINIT or to have a voltage VRL that is close to the activated initialization voltage VINIT.

Subsequently, if the high power supply voltage ELVDD is activated, the voltage of the repair line initialization transistor TRLI may be increased based on a current flowing from the high power supply voltage ELVDD through the resistor R to the capacitor C, and thus the repair line initialization transistor TRLI may be turned off to disconnect the initialization voltage VINIT from the repair line RL. Subsequently, even if the low power supply voltage ELVSS is activated, the OLED EL may be prevented from undesirably emitting light because the repair line RL is previously initialized to have a voltage VRL that is lower than a sum of the low power supply voltage ELVSS and a threshold voltage VTHEL of the OLED EL. As described above, the switching circuit 140f may prevent the undesired light-emission of the OLED EL caused by a voltage difference between the voltage VRL of the repair line RL and the lower power supply voltage ELVSS during the power-up of the OLED display device 100f.

Figure 15:
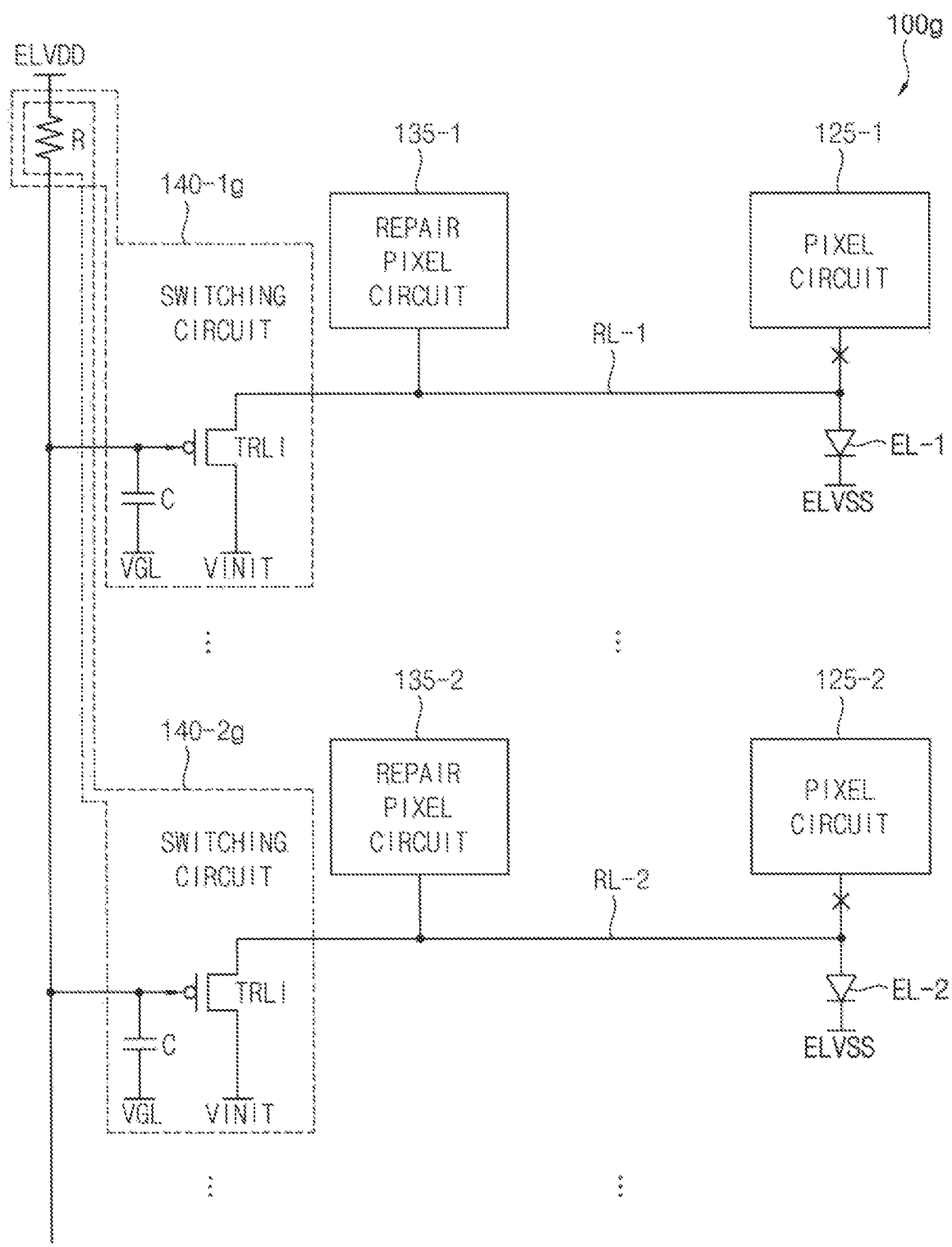
FIG. 15 is a diagram illustrating a portion of an OLED display device according to example embodiments.

FIG. 15 is a diagram illustrating a portion of an OLED display device according to example embodiments.

Referring to FIG. 15, an OLED display device 100g may include a plurality of switching circuits 140-1g and 140-2g respectively connected to a plurality of repair lines RL-1 and RL-2, and each switching circuit 140-1g and 140-2g may include a repair line initialization transistor TRLI, a capacitor C, and a resistor R. In some example embodiments, as illustrated in FIG. 15, the resistor R connected to a high power supply voltage ELVDD may be shared by the plurality of switching circuits 140-1g and 140-2g. Each switching circuit 140-1g and 140-2g may have the same or similar configuration and operation to the switching circuit 140f of the embodiment shown in FIG. 13, except that the switching circuits 140-1g and 140-2g share the resistor R.

Figure 16:
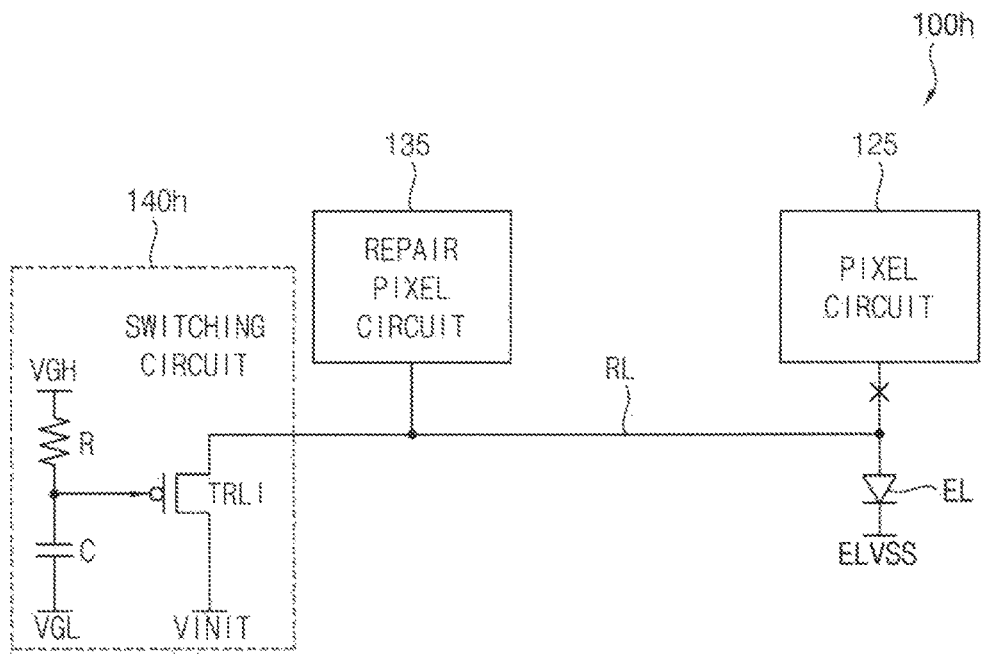
FIG. 16 is a diagram illustrating a portion of an OLED display device according to example embodiments.

FIG. 16 is a diagram illustrating a portion of an OLED display device according to example embodiments.

Referring to FIG. 16, a switching circuit 140h of an OLED display device 100h may include a repair line initialization transistor TRLI having a source connected to a repair line RL, a drain connected to an initialization voltage VINIT, and a gate, and may also include a capacitor C that is connected between the gate of the repair line initialization transistor TRLI and a gate low voltage VGL, and a resistor R that is connected between a gate high voltage VGH and the gate of the repair line initialization transistor TRLI. The switching circuit 140h of FIG. 16 may have the same or similar configuration and operation to the switching circuit 140f of the embodiment shown in FIG. 13, except that the resistor R is connected to the gate high voltage VGH instead of being connected to a high power supply voltage ELVDD.

Figure 17:
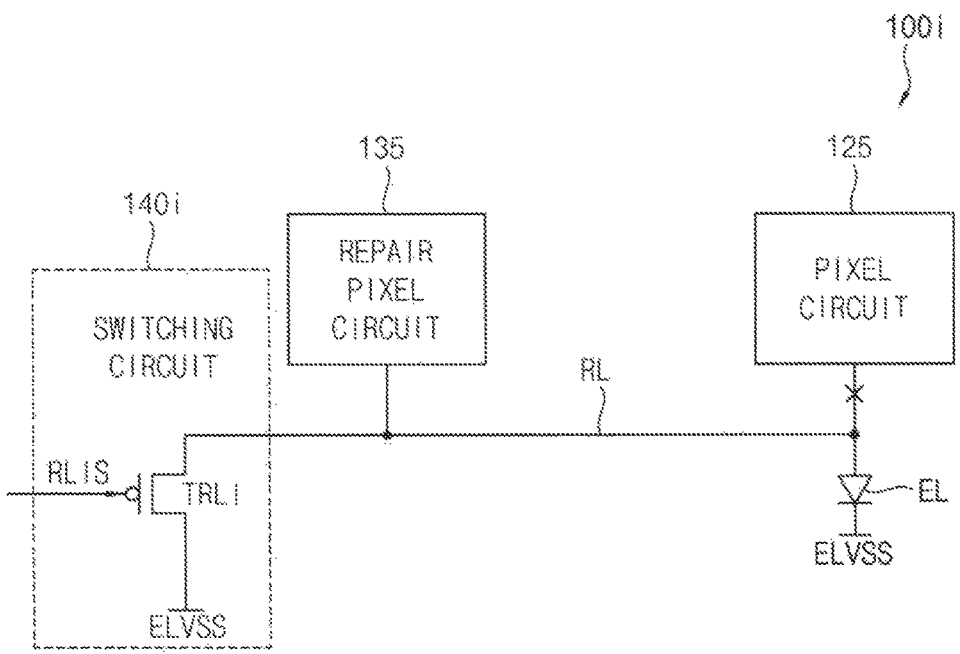
FIG. 17 is a diagram illustrating a portion of an OLED display device according to example embodiments.

FIG. 17 is a diagram illustrating a portion of an OLED display device according to example embodiments.

Referring to FIG. 17, a switching circuit 140i of an OLED display device 100i may include a repair line initialization transistor TRLI configured to connect a low power supply voltage ELVSS to a repair line RL in response to a repair line initialization signal RLIS. In some example embodiments, the repair line initialization signal RLIS may be generated by a timing controller of the OLED display device 100i, and the repair line initialization transistor TRLI may receive the repair line initialization signal RLIS from the timing controller. The switching circuit 140*i* of FIG. 17 may have the same or similar configuration and operation to the switching circuit 140*a* of the embodiment shown in FIG. 4, except that the low power supply voltage ELVSS, instead of a gate low voltage VGL, is applied to the repair line RL. When the low power supply voltage ELVSS is activated, the low power supply voltage ELVSS may be applied not only to a cathode electrode of an OLED EL, but may also be applied to the repair line RL, and thus, undesired light-emission of the OLED EL otherwise caused by a voltage difference between a voltage of the repair line RL and the lower power supply voltage ELVSS during a power-up of the OLED display device 100*f* may be prevented.

Figure 18:
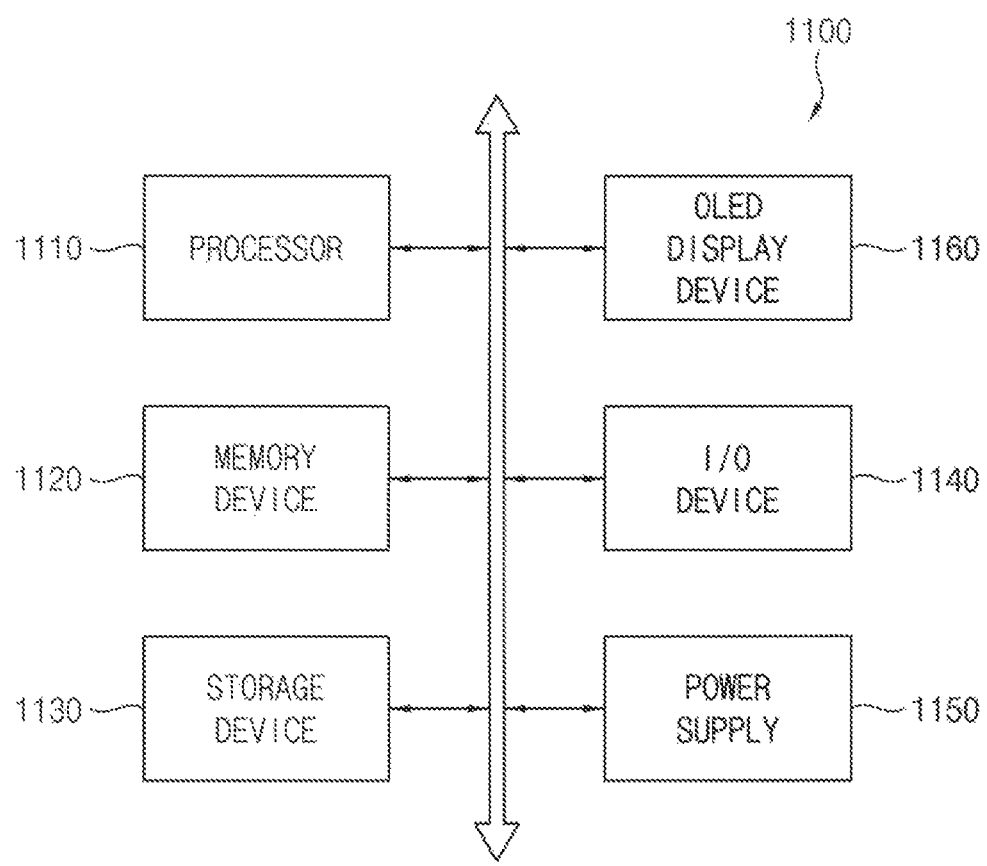
FIG. 18 is a block diagram illustrating an electronic device including an OLED display device according to example embodiments.

FIG. 18 is a block diagram illustrating an electronic device including an OLED display device according to example embodiments.

Referring to FIG. 18, an electronic device 1100 may include a processor 1110, a memory device 1120, a storage device 1130, an input/output (I/O) device 1140, a power supply 1150, and an OLED display device 1160. Here, the OLED display device 1160 may correspond to the OLED display device 100, 100*a*, 100*b*, 100*c*, 100*d*, 100*e*, 100*f*, 100*g*, 100*h*, and 100*i* of the embodiments illustrated in FIGS. 1 through 17. In addition, the electronic device 1100 may further include a plurality of ports for communicating a video card, a sound card, a memory card, a universal serial bus (USB) device, other electronic devices, etc.

The processor 1110 may perform various computing functions. The processor 1110 may be a microprocessor, a central processing unit (CPU), an application processor (AP), etc. The processor 1110 may be coupled to other components via an address bus, a control bus, a data bus, etc. Further, the processor 1110 may be coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 1130 may be a solid state drive (SSD) device, a hard disk drive (HDD) device, a CD-ROM device, etc. The I/O device 1140 may be an input device such as a keyboard, a keypad, a mouse device, a touchpad, a touchscreen, a remote controller, etc., and an output device such as a printer, a speaker, etc. The power supply 1150 may provide power for operations of the electronic device 1100.

The OLED display device 1160 may provide a repair line with a second voltage (e.g., a gate low voltage VGL, an initialization voltage VINIT, or a low power supply voltage ELVSS) that is activated before or when a first voltage (e.g., the low power supply voltage ELVSS) connected to an OLED is activated, thereby preventing undesired light-emission of the OLED connected to the repair line during a power-up of the OLED display device 1160.

According to example embodiments, the electronic device 1100 may be any electronic device including the OLED display device 1160, such as a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their functional equivalents.

What is claimed is:

1. A display device comprising:
   a display panel having a display region and a peripheral region;
   a light emitting diode at the display region and comprising an end connected to a power supply for applying a first voltage;
   a pixel circuit at the display region;
   a repair pixel circuit at the peripheral region;
   a repair line for connecting the repair pixel circuit to an anode of the light emitting diode; and
   a switching circuit configured to apply a second voltage to the repair line during a power-up of the display device before applying the first voltage to a cathode of the light emitting diode.

2. The display device of claim 1, wherein the second voltage is activated before the first voltage is activated.

3. The display device of claim 2, wherein the first voltage is a low power supply voltage, and
   wherein the second voltage is a gate low voltage.

4. The display device of claim 2, wherein the first voltage is a low power supply voltage, and
   wherein the second voltage is an initialization voltage.

5. The display device of claim 1, wherein the second voltage is activated when the first voltage is activated.

6. The display device of claim 5, wherein the first voltage and the second voltage are a same low power supply voltage.

7. The display device of claim 1, wherein the switching circuit is configured to initialize the repair line such that a voltage between an anode electrode of the light emitting diode and a cathode electrode of the light emitting diode is lower than a threshold voltage of the light emitting diode.

8. The display device of claim 7, wherein the cathode electrode of the light emitting diode is connected to the first voltage,
   wherein the anode electrode of the light emitting diode is connected to the repair pixel circuit instead of to the pixel circuit when the pixel circuit is defective, and
   wherein the second voltage is lower than a sum of the first voltage and the threshold voltage of the light emitting diode.

9. The display device of claim 7, wherein the anode electrode of the light emitting diode is connected to the first voltage,
wherein the cathode electrode of the light emitting diode is connected to the repair pixel circuit instead of the pixel circuit when the pixel circuit is defective, and
wherein the second voltage is higher than the first voltage less the threshold voltage of the light emitting diode.

10. The display device of claim 1, wherein the switching circuit comprises a repair line initialization transistor that is configured to connect the second voltage to the repair line.

11. The display device of claim 10, wherein the repair line initialization transistor is configured to receive a repair line initialization signal from a timing controller in the display device, and is configured to connect the second voltage to the repair line in response to the repair line initialization signal.

12. The display device of claim 10, wherein the repair line initialization transistor comprises:
a source connected to the repair line;
a drain connected to the second voltage; and
a gate, and
wherein the switching circuit further comprises:
a capacitor connected between the gate of the repair line initialization transistor and the drain of the repair line initialization transistor; and
a resistor connected between a third voltage and the gate of the repair line initialization transistor.

13. The display device of claim 12, wherein the third voltage is configured to be activated during or after activation of the second voltage.

14. The display device of claim 13, wherein the repair line initialization transistor is configured to be turned on in response to the activated second voltage to connect the second voltage to the repair line, and
wherein the repair line initialization transistor is configured to be turned off in response to the activated third voltage to disconnect the second voltage from the repair line.

15. The display device of claim 12, wherein the third voltage is a high power supply voltage.

16. The display device of claim 12, wherein the third voltage is a gate high voltage.

17. The display device of claim 12, further comprising another switching circuit configured to apply the second voltage to another repair line during the power-up of the display device,
wherein the resistor connected to the third voltage is shared by the switching circuit and the other switching circuit.

18. The display device of claim 10, wherein the repair line initialization transistor comprises:
a source connected to the repair line;
a drain connected to the second voltage; and
a gate, and
wherein the switching circuit further comprises:
a capacitor connected between the gate of the repair line initialization transistor and a fourth voltage; and
a resistor connected between a third voltage and the gate of the repair line initialization transistor.

19. The display device of claim 18, wherein the first voltage is a low power supply voltage,
wherein the second voltage is an initialization voltage, and
wherein the fourth voltage is a gate low voltage.

20. A display device comprising:
a display panel having a display region and a peripheral region;
a light emitting diode at the display region, and comprising an end configured to receive a first voltage;
a pixel circuit at the display region;
a repair pixel circuit at the peripheral region;
a repair line for connecting the repair pixel circuit to an anode of the light emitting diode; and
a repair line initialization transistor comprising:
a source connected to the repair line; and
a drain connected to a second voltage,
wherein the second voltage is configured to be applied to the repair line during a power-up of the display device before the first voltage is received by a cathode of the light emitting diode.

21. The display device of claim 20, wherein the second voltage is configured to be activated before or during activation of the first voltage.

22. The display device of claim 20, wherein the first voltage is a low power supply voltage, and
wherein the second voltage is a gate low voltage, an initialization voltage, or the low power supply voltage.

23. The display device of claim 20, further comprising:
a capacitor connected between a gate of the repair line initialization transistor and the drain of the repair line initialization transistor; and
a resistor connected between a third voltage and the gate of the repair line initialization transistor.

24. The display device of claim 23, wherein the third voltage is a high power supply voltage or a gate high voltage.

* * * * *